(12) United States Patent
Takao

(10) Patent No.: US 7,061,112 B2
(45) Date of Patent: Jun. 13, 2006

(54) SEMICONDUCTOR DEVICE INCLUDING AN ELECTRICAL CONTACT CONNECTED TO AN INTERCONNECTION

(75) Inventor: Yoshihiro Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/743,438

(22) Filed: Dec. 23, 2003

(65) Prior Publication Data

US 2004/0135259 A1 Jul. 15, 2004

(30) Foreign Application Priority Data

Dec. 27, 2002 (JP) .......................... 2002-379569

(51) Int. Cl.
*H01L 23/48* (2006.01)

(52) U.S. Cl. .................. 257/758; 257/760; 257/773
(58) Field of Classification Search ............... 257/758, 257/760, 773
See application file for complete search history.

(56) References Cited

U.S. PATENT DOCUMENTS 6,017,815 A * 1/2000 Wu .......................... 438/634
6,040,224 A * 3/2000 Tsukamoto ................. 438/308
6,239,025 B1 * 5/2001 Bease et al. ................ 438/637
6,407,455 B1 * 6/2002 Wald et al. ................. 257/774
6,753,611 B1   6/2004 Maeno et al.
6,787,907 B1   9/2004 Watanabe et al.

FOREIGN PATENT DOCUMENTS

| JP | 2001-085614   | 3/2001 |
| JP | 2002-043417   | 2/2002 |
| JP | 2002-217316 A | 8/2002 |
| JP | 2004-063855   | 2/2004 |

* cited by examiner

Primary Examiner—T. N. Quach
(74) Attorney, Agent, or Firm—Westerman, Hattori, Daniels & Adrian, LLP

(57) ABSTRACT

The semiconductor device comprises an interconnection buried in an interconnection groove formed in a lower insulating film, and an upper insulating film having a contact hole formed down to an end part of the interconnection. The interconnection groove is formed by using a design pattern having a main interconnection portion 100 and an extended portion 104 provided at an end part of a main interconnection portion 100 for forming the interconnection and extended perpendicularly to an extending direction of the main interconnection portion 100.

8 Claims, 13 Drawing Sheets

INTERCONNECTION PITCH INCREASED

SEMICONDUCTOR DEVICE INCLUDING AN ELECTRICAL CONTACT CONNECTED TO AN INTERCONNECTION

CROSS-REFERENCE TO RELATED APPLICATIONS

This application is based upon and claims the benefit of priority from the prior Japanese Patent Application No. 2002-379569, filed on Dec. 27, 2002, the entire contents of which are incorporated herein by reference.

BACKGROUND OF THE INVENTION

The present invention relates to a semiconductor device and a method for fabricating the same, more specifically to a semiconductor device including an electrical contact connected to a damascene interconnection, and a method for fabricating the same.

As semiconductor devices are larger-scaled and integrated higher, design rules of the interconnections are diminished as the generations. Conventionally, interconnections have been formed by depositing conducting materials and patterning the deposited conducting materials by lithography and dry etching. However, as the generations advance, this has found technical limitations. As a new process for forming the interconnections, which takes over the conventional process for forming the interconnections, the so-called damascene process, in which groove patterns and hole patterns are formed in an inter-layer insulating film, and a conducting material is buried in the grooves and the holes, is becoming prevalent.

The damascene process can be applied not only to forming metal interconnections of materials, such as copper, etc., which are difficult to be dry etched, but also to forming fine interconnections, such as local interconnections, etc., to be connected to a silicon substrate or a gate interconnection. In the semiconductor device described, e.g., in Japanese published unexamined patent application No. 2002-217316, the damascene interconnections are used as local interconnections of SRAM cells.

However, in contacting an upper interconnection layer to a lower damascene interconnection layer, contact failures, such as increases of the contact resistance, the disconnection of the interconnection, etc., often take place.

SUMMARY OF THE INVENTION

An object of the present invention is to provide a semiconductor device and the method for fabricating the same which can prevent defective contacts electrically connecting interconnections to damascene interconnections.

According to one aspect of the present invention, there is provided a semiconductor device comprising: a first insulating film formed over a semiconductor substrate; an interconnection buried in at least a surface side of the first insulating film, and having a main interconnection portion and an extended portion provided at an end part of the main interconnection portion and extended perpendicularly to an extending direction of the main interconnection portion; and a second insulating film formed on the first insulating film and having a contact hole down to the end part of the main interconnection portion of the interconnection.

According to another aspect of the present invention, there is provided a semiconductor device comprising: a first interconnection formed over a semiconductor substrate, extended in a first direction; a first insulating film formed over the semiconductor substrate with the first interconnection formed on; a second interconnection buried in at least a surface side of the first insulating film, and having a main interconnection portion extended in a second direction intersecting the first direction and bridging the first interconnection and an extended portion provided at an end part of the main interconnection portion and extended in the first direction; and a second insulating film formed on the first insulating film, and having a contact hole down to the end part of the main interconnection portion of the second interconnection.

According to further another aspect of the present invention, there is provided a method for fabricating a semiconductor device comprising the steps of: forming an interconnection groove in a first insulating film; burying an interconnection in the interconnection groove; forming a second insulating film on the first insulating film with the interconnection layer buried in; and forming a contact hole in the second insulating film down to an end part of the interconnection, in which in the step of forming an interconnection groove, the interconnection groove is formed by using a design pattern having a main interconnection portion and an extended portion provided on an end part of the main interconnection portion and extended perpendicularly to an extending direction of the main interconnection portion.

According to the present invention, in forming an interconnection buried in an insulating film, an interconnection groove for the interconnection to be buried in is formed by using a design pattern having an main interconnection portion and an extended portion provided on an end of the main interconnection portion and extended perpendicularly to an extending direction of the main interconnection portion, whereby the interconnection groove can be formed while the shrinkage of the pattern end due to the proximity effect upon the exposure is effectively suppressed. Thus, reliability of the electrical contact with an upper interconnection connected to the end part of the damascene interconnection can be higher.

BRIEF DESCRIPTON OF THE DRAWINGS

DETAILED DESCRIPTION OF THE INVENTION

[The Principle of the Present Invention]

As described above, in forming an electrical contact to be connected to an end part of a damascene interconnection, the defective contact often occurs between the damascene interconnection and the upper interconnection.

The inventor of the present invention has made earnest studies of causes of this problem and found that the proximity effect in the lithography step for forming an interconnection groove for a damascene interconnection to be buried in causes the problem. The proximity effect is more conspicuous in the pattern end part of a perforated pattern than in the pattern end part of a left pattern. In forming a groove-shaped perforated pattern to be used in forming an interconnection groove, a position of the pattern end is shrunk from a position of the design pattern due to the proximity effect. Accordingly, when a contact region is arranged to overlap the pattern end part of the design pattern, the end of the formed pattern is shrunk toward the contact region, and the contact region is decreased. Often a worst result is that the electrical contact cannot be formed.

Figure 1A:
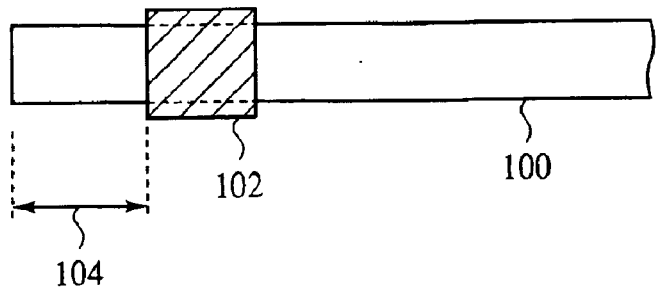
FIGS. 1A and 1B are views explaining effects of providing the extended portion extended along the extending direction of the main interconnection portion.
Figure 1B:
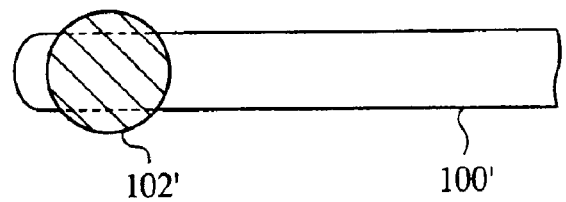

As means for preventing the shrinkage of the pattern in exposure, it is proposed that on a design pattern, an interconnection pattern 100 is extended outward beyond a contact region 102, providing an extended portion 104 as exemplified in FIG. 1A. The extended portion 104 of a suitable length is provided, whereby decrease of a contact area by reaching the end of the finished interconnection pattern 100' into the contact region 102' can be prevented as exemplified in FIG. 1B, even when the end part of the finished interconnection pattern 100' is shrunk due to the proximity effect upon the exposure. Thus, the contact resistance increase and the defective contact can be prevented. In 90 nm-generation, for example, a local interconnection of, e.g., a 0.12 µm-width is formed by ArF exposure system. In this case, in order to ensure a sufficient contact area, the extended portion must have a length substantially equal to the width of the local interconnection.

Figure 1C:
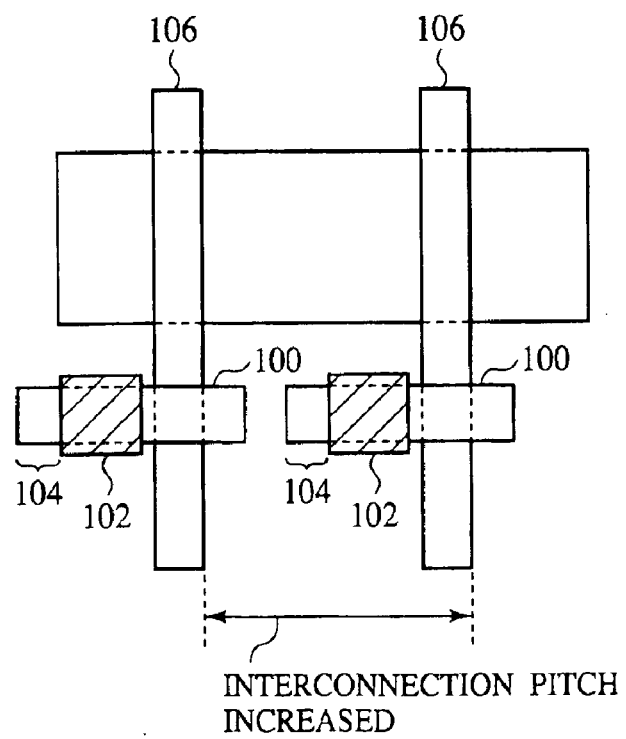
FIG. 1C is a view explaining problems of providing the extended portion extended along the extending direction of the main interconnection portion.

However, in forming interconnection patterns 100, intersecting gate interconnections 106 as exemplified in FIG. 1C, when the interconnections 100 having extended portion 104 are arranged adjacent to each other, the gate interconnections 106 must be designed at a pitch which is larger by a length of the extended portion 104. Resultantly, the device integration is low.

Figure 2A:
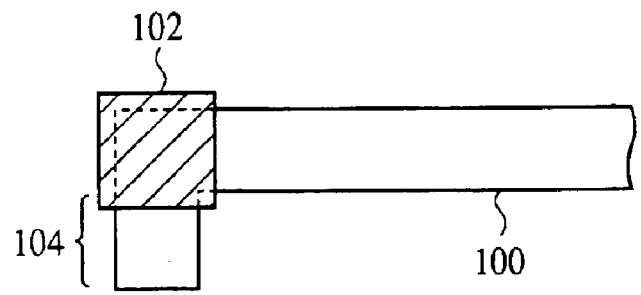
FIGS. 2A–2C are views explaining effects produced by providing the extended portion extended in one direction perpendicular to the extending direction of the main interconnection portion.

In the present invention, as shown in FIG. 2A, an extended portion 104 extended perpendicularly to an extending direction of an interconnection pattern (main interconnection portion) 100 is provided on an end part of the interconnection pattern 100. The extended portion 104 extended perpendicularly to the extending direction of the interconnection pattern 100 can also compensate the shrinkage of the pattern end part due to the proximity effect upon the exposure.

Figure 2B:
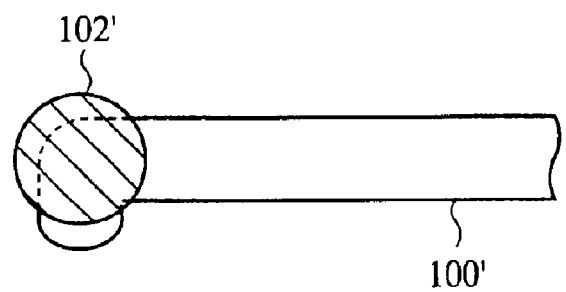

In an interconnection pattern 100' formed by using such design pattern, as exemplified in FIG. 2B, the planar shape of the end part of the interconnection pattern 100' is bulged in one direction perpendicular to the extending direction of the interconnection pattern 100'.

Figure 2C:
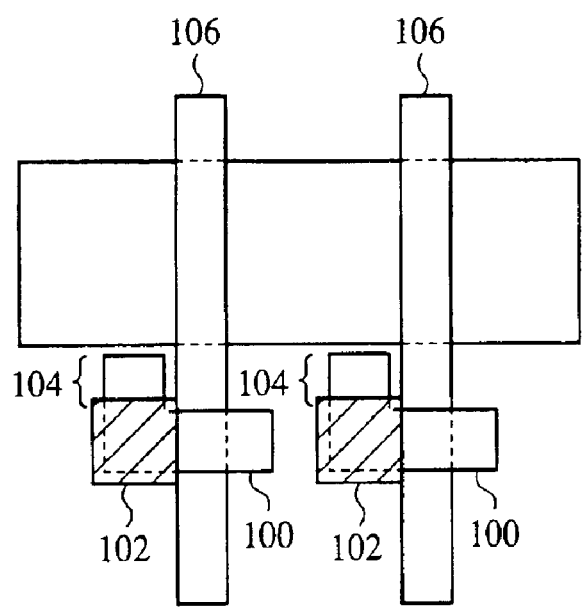

Such design of the interconnection pattern makes it unnecessary to make a pitch between gate interconnections 106 larger even when interconnection patterns 100 bridge the gate interconnections 106 as exemplified in FIG. 2C. Accordingly, the defective contact can be precluded without sacrificing the device integration.

Figure 3A:
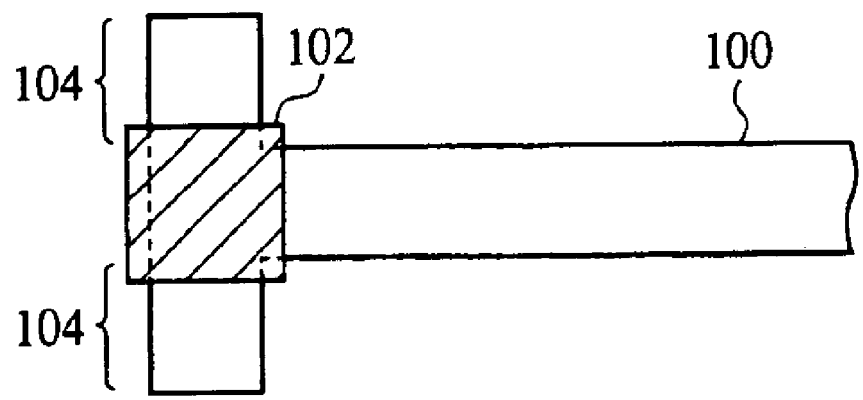
FIGS. 3A and 3B are views explaining effects produced by providing the extended portions extended in two directions perpendicular to the extending direction of the main interconnection portion.
Figure 3B:
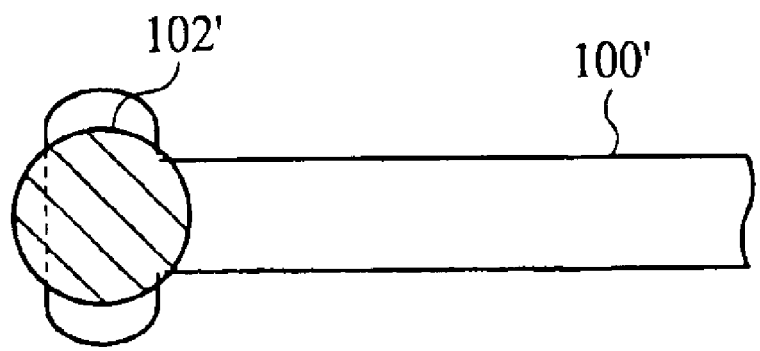

The extended portion may be extended in one direction as shown in FIG. 2A or may be extended in two directions as shown in FIG. 3A. The use of the pattern shown in FIG. 3A can also compensate the shrinkage of the end part of the interconnection pattern 100. In the interconnection pattern 100' formed by using the interconnection pattern 100 shown in FIG. 3A, as exemplified in FIG. 3B, the shape of the end part of the interconnection pattern 100' is bulged in two directions perpendicular to the extending direction of the interconnection pattern 100'.

It is preferable that the width of the extended portion 104 is substantially equal to that of the interconnection pattern 100. This is because that when the extended portion 104 has a large width, there is a risk that the breakdown voltage with respect to the adjacent interconnection might be decreased. When a width of the extended portion 104 is substantially equal to that of the interconnection pattern 100, a length of the bulged part of the end region of the interconnection pattern 100' is below the width of the interconnection pattern 100'.

Figure 4:
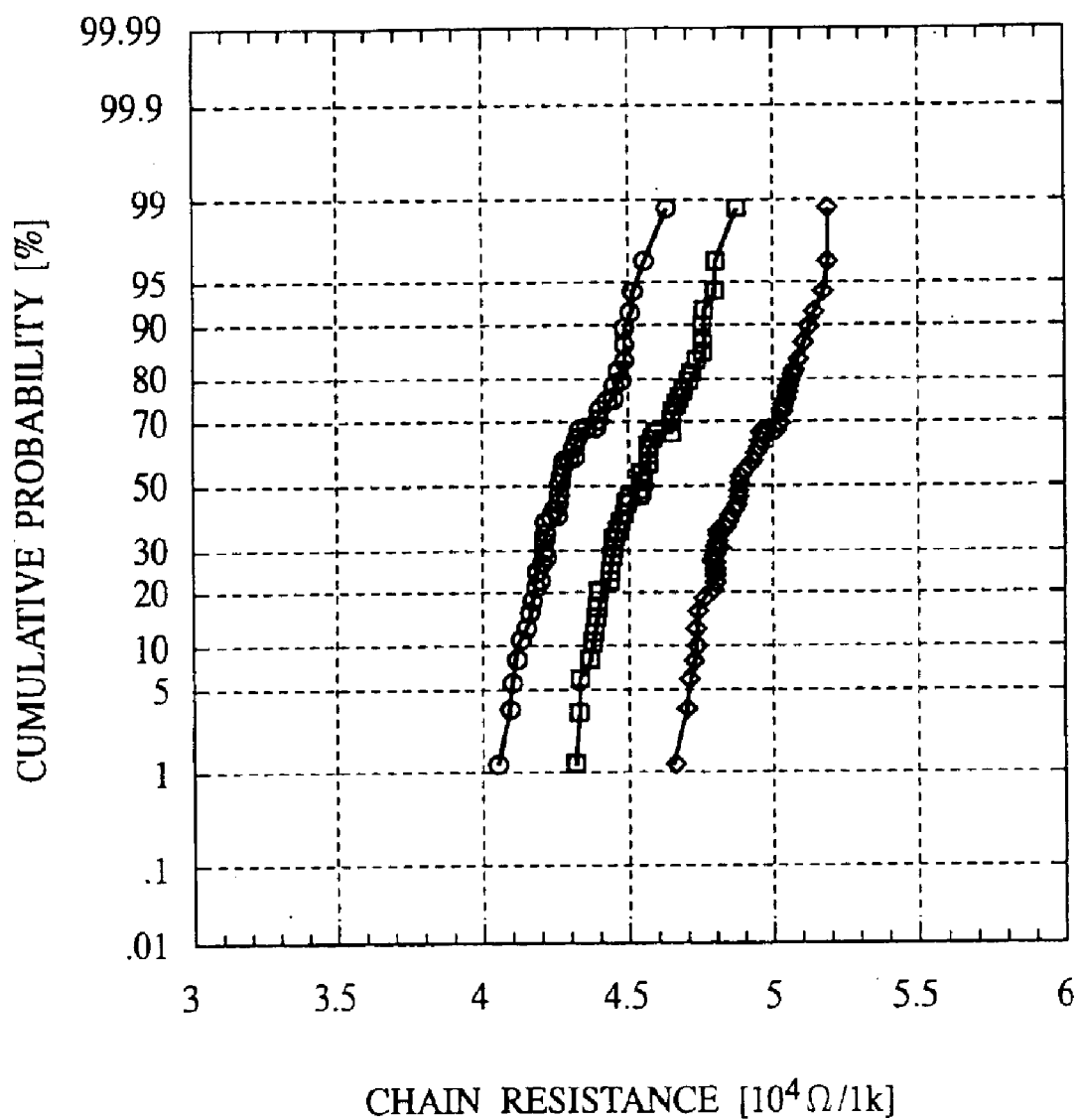
FIG. 4 is a graph of relationships between the length of the extended portion provided along the extending direction of the main interconnection portion, and the contact resistance.
Figure 5:
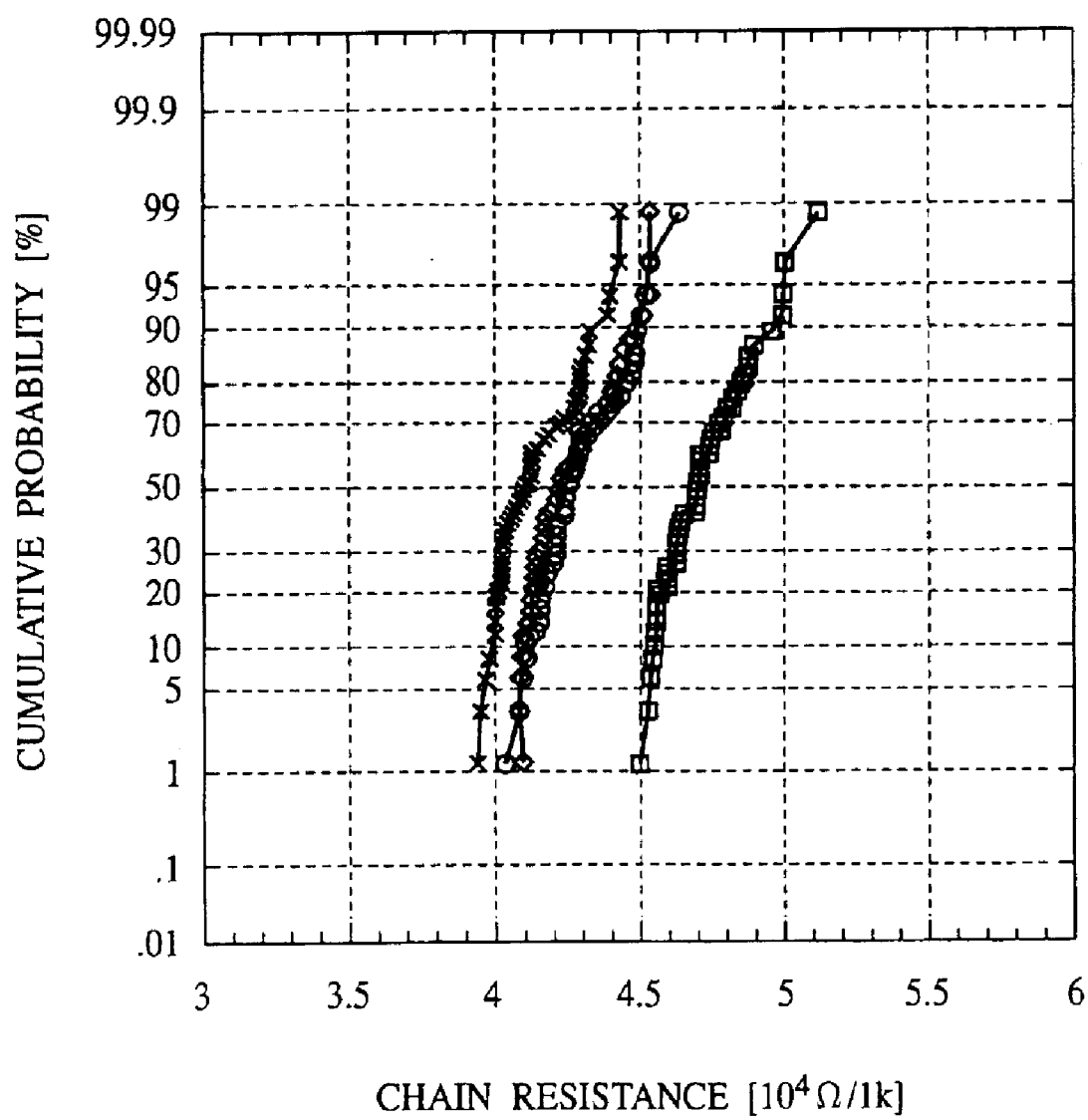
FIG. 5 is a graph of relationships between the length of the extended portion provided in one direction perpendicular to the extending direction of the main interconnection portion, and the contact resistance.
Figure 6:
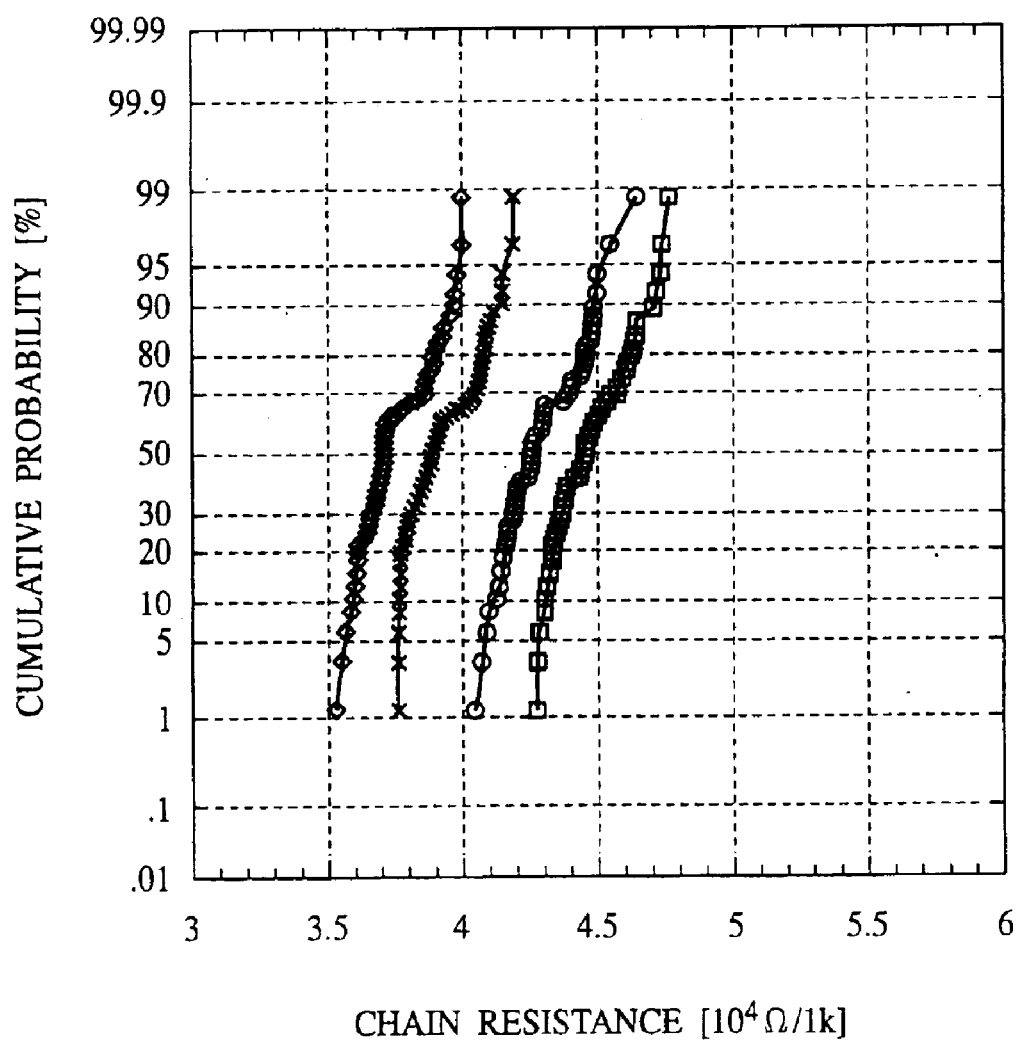
FIG. 6 is a graph of relationships between the length of the extended portions provided in two directions perpendicular to the extending direction of the main interconnection portion, and the contact resistance.

FIGS. 4 to 6 are graphs of cumulative probability plots of measured resistance values of contact chains of 1000 serially connected contacts connected to a damascene interconnection. FIG. 4 shows the graphs of the case that the extended portion is provided along the extending direction of the damascene interconnection (hereinafter called "I-shape"). FIG. 5 shows the graph of the case that the extended portion is provided in one direction perpendicular to the extending direction of the damascene interconnection (hereinafter called "L-shape"). FIG. 6 shows the graph of the case that the extended portions provided in two directions perpendicular to the extending direction of the damascene interconnection (hereinafter called "T-shape"). The damascene interconnection has a 0.12 µm-width.

In FIG. 4, the ○ marks indicate the case that the extended portion has a 0.11 µm-length. The □ marks indicate the case that the extended portion has a 0.06 µm-length. The Δ marks indicate the case that the extended portion is not provided.

As shown, it is seen that the provision of the extended portion decreases the resistance value. This means that the provision of the extended portion compensate the shrinkage of the pattern end part. It is also seen that as the extended portion is longer, the resistance value is more decreased. This means that as the extended portion is larger, the contact area is increased.

In FIG. 5, the □ marks indicate the case that the extended portion has a 0.02 µm-length. The ◇ marks indicate the case that the extended portion has a 0.04 µm-length. The x marks indicate the case that the extended portion has a 0.06 µm-length. The ○ marks indicate the case that the extended portion is extended by 0.11 µm along the extending direction of the damascene interconnection and correspond to the case indicated by the ○ marks in FIG. 4.

As shown, the provision of the 0.02 μm extended portion in the L-shape can slightly decrease the resistance value in comparison with the case that the extended portion is not provided (indicated by the ◇ marks in FIG. 4). The provision of the 0.04 □m extended portion in the L-shape can further decrease the resistance value and can make the resistance value substantially equal to that of the case that the 0.11 μm extended portion is provided in the I-shape. The provision of the 0.06 μm extended portion in the L-shape can further decrease the resistance value. Thus, providing the extended portion in the L-shape is more effective than providing the extended portion in the I-shape.

In FIG. 6, the □ marks indicate the case that the extended portions are provided on both sides respectively in a 0.02 μm-length. The ◇ marks indicate the case that the extended portions are provided on both sides respectively in a 0.04 μm-length. The x marks indicate the case that the extended portions are provided on both sides respectively in a 0.06 μm-length. The ○ marks indicate the case that the extended portion is provided by 0.11 μm along the extending direction of the damascene interconnection and corresponds to the case indicated by the ○ marks in FIG. 4.

As shown, providing the extended portion in the T-shape in a 0.02 μm or more length as well as the provision of the extended portion in the L-shape can decrease the resistance value in comparison with providing no extended portion (indicated by the ◇ marks in FIG. 4).

Based on the above-described measured results, a length of the extended portion is set preferably to be above at least about ⅙ of an interconnection width, more preferably to be above about ⅓ of the interconnection width. The upper limit of the length of the extended portion is set preferably to be about ½ of the interconnection width. This is because a too large length of the extended portion might hinder dense arrangement of interconnections. However, an upper limit of the length of the extended portion can be suitably set corresponding to a pitch of adjacent patterns.

Figure 7A:
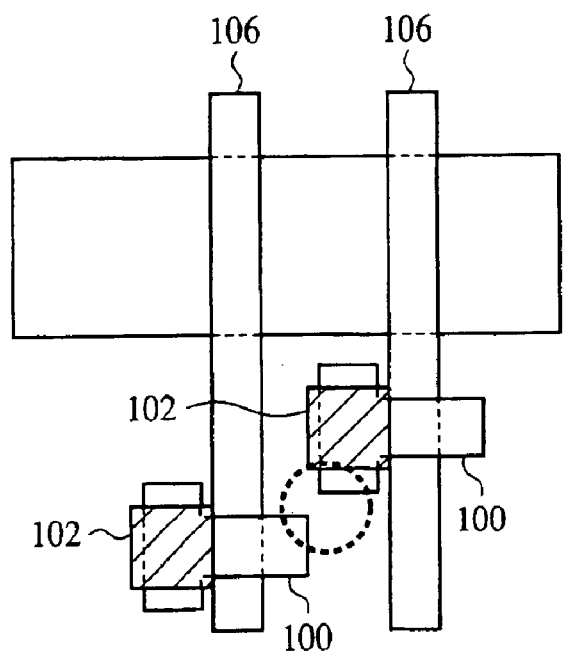
FIGS. 7A and 7B are views showing the influence of arrangement of the extended portion on the pattern pitch.
Figure 7B:
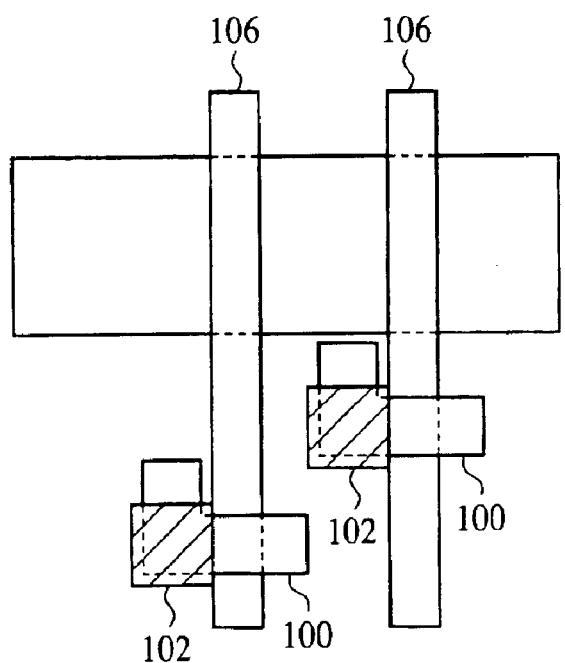

Whether L-shaped extended portion or T-shaped extended portions are provided can be also suitably selected corresponding to relationships between adjacent patterns. For example, when interconnection patterns 100 having T-shaped extended portions are arranged adjacent to each other as shown in FIG. 7A, the minimum pitch between the interconnection patterns 100 is so small (indicated by the dotted line), and the breakdown voltage margin might be decreased. In such case, as shown in FIG. 7B, interconnection patterns 100 having L-shaped extended portion is used, whereby the patterns can be more spaced from each other without changing a pitch between the interconnection patterns 100.

Thus, the extended portion is provided perpendicularly to the extending direction of the interconnection pattern, whereby the extended portion can be shorter for an equal contact resistance than the extended portion provided along the extending direction of the interconnection pattern. Accordingly, the defective contact can be precluded while decrease of device integration is suppressed.

[An Embodiment]

The semiconductor device and the method for fabricating the same according to one embodiment of the present invention will be explained with reference to FIGS. 8 to 13B.

Figure 8:
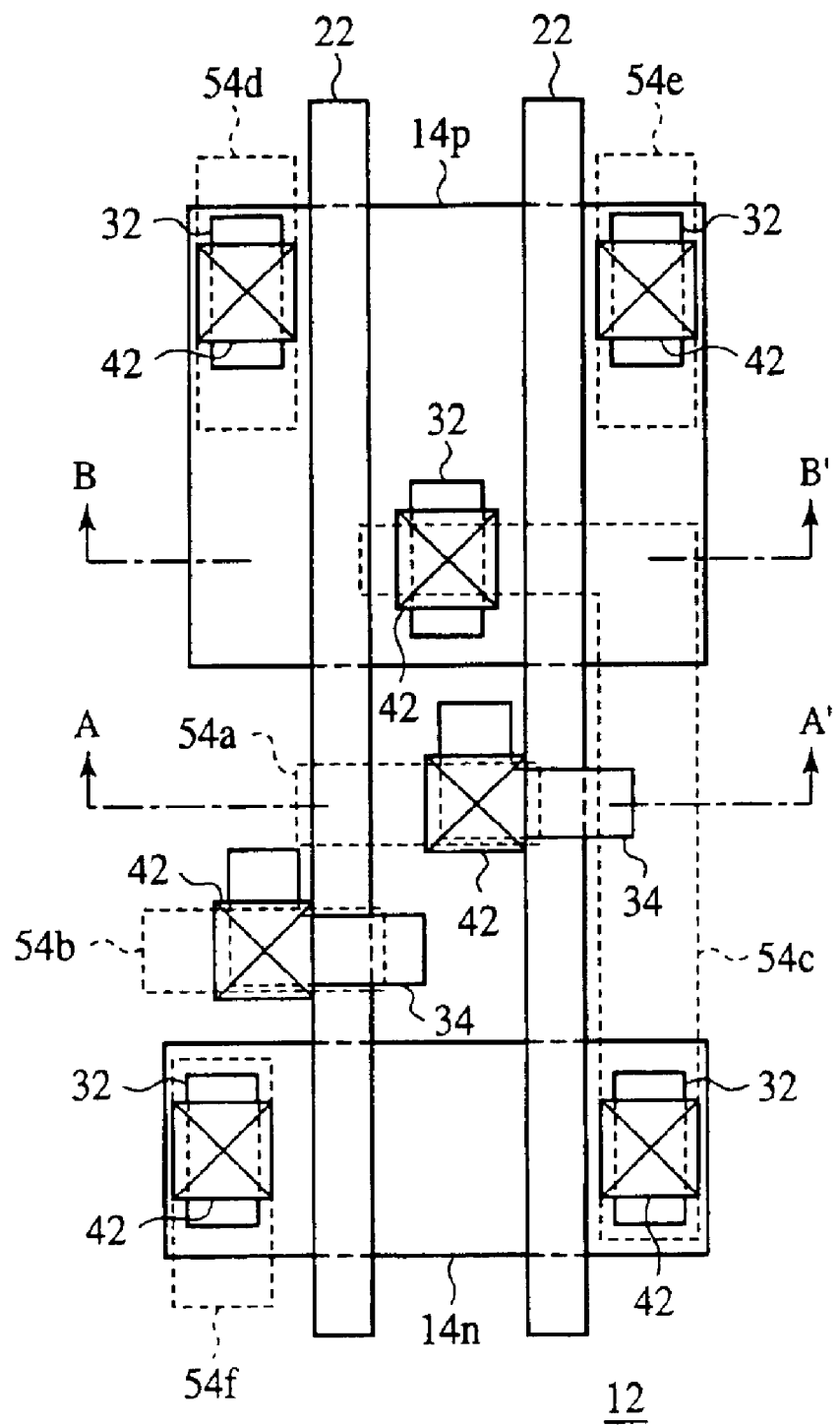
FIG. 8 is a plan view of the semiconductor device according to an embodiment of the present invention, which shows a structure thereof.
Figure 9:
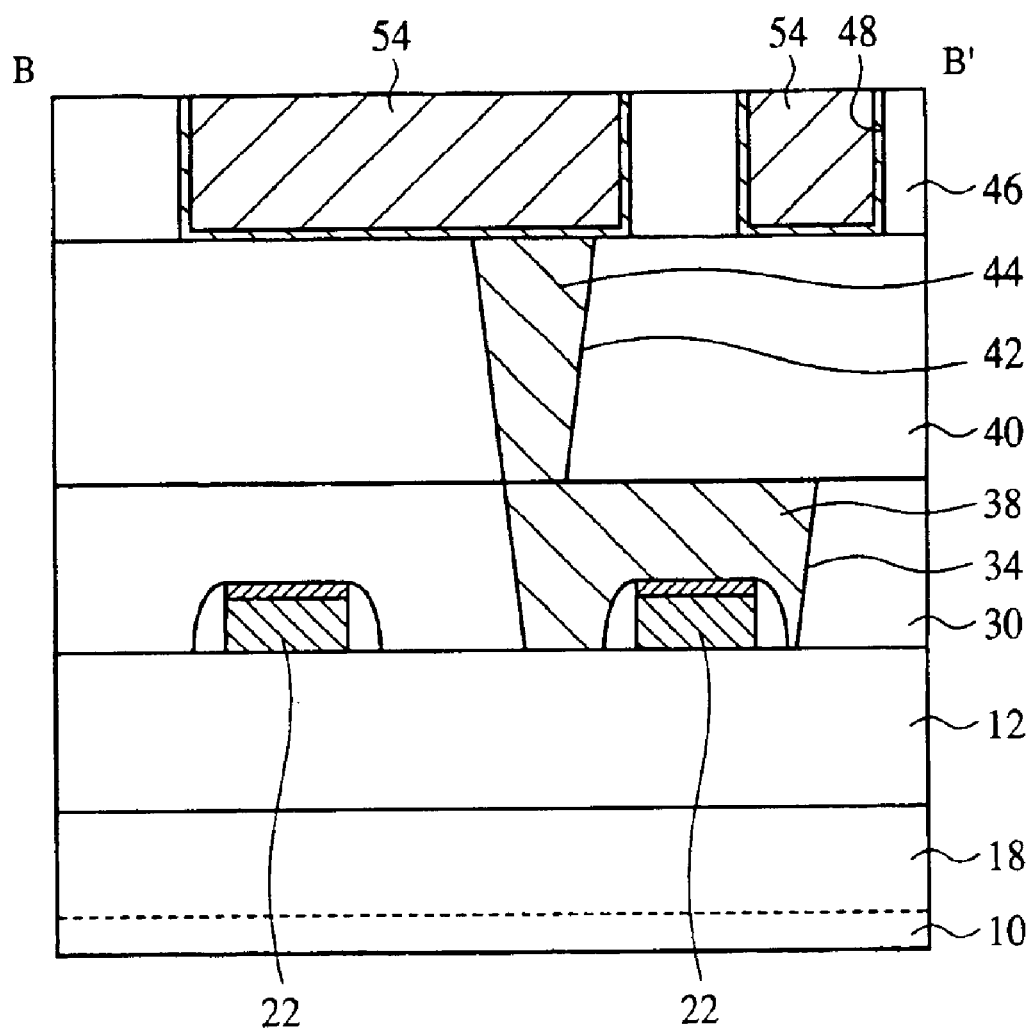
FIG. 9 is a diagrammatic sectional view of the semiconductor device according to the embodiment of the present invention, which shows the structure thereof.

FIG. 8 is a plan view of the semiconductor device according to the present embodiment, which shows a structure thereof. FIG. 9 is a diagrammatic sectional view of the semiconductor device according to the present embodiment, which shows the structure thereof. FIGS. 10A to 13B are sectional views of the semiconductor device according to the present embodiment in the steps of the method for fabricating the same, which show the method.

First, the structure of the semiconductor device according to the present embodiment will be explained with reference to FIGS. 8 and 9. FIG. 8 is a planar pattern of the semiconductor device upon a design pattern. FIG. 9 is a diagrammatic sectional view along the line A–A' in FIG. 8.

A device isolation film 12 defining a device region 14n for n-channel transistors formed in and a device region 14p for p-channel transistors formed in is formed in a silicon substrate 10.

Gate electrodes 22 are formed over the device regions 14n, 14p with a gate insulating film 20 interposed therebetween. Two gate electrodes 22 are respectively formed over the device regions 14n, 14p. The respective gate electrodes 22 formed over the device region 14n and the respective gate electrodes 22 formed over the device region 14p are formed in the continuous single patterns. Source/drain regions are formed respectively in the silicon substrate 10 on both sides of the gate electrodes 22. Thus, two n-channel transistors are formed in the device region 14n, and the two p-channel transistors are formed in the device region 14p.

An inter-layer insulating film 30 is formed on the silicon substrate 10 with the transistors formed on. In the inter-layer insulating film, contact holes 32 are formed down to the device regions 14n, 14p, and interconnection grooves 34 for local interconnections to be buried in are formed. In the interconnection grooves 34, local interconnections 38 electrically connected to the gate electrodes 22 are buried in.

An inter-layer insulating film 40 is formed on the inter-layer insulating film 30 with the contact plugs 36 and the local interconnections 38 buried in. Contact holes 42 are formed in the inter-layer insulating film 40. Contact plugs 44 electrically connected to the contact plugs 36 or the local interconnections 38 are buried in the contact holes 42.

An inter-layer insulating film 46 is formed on the inter-layer insulating film 40 with the contact plugs 44 buried in. Interconnection grooves 48 are formed in the inter-layer insulating film 46. An interconnections 54 of a conducting layer formed mainly of copper are buried in the interconnection grooves 48.

Thus, 2-input NAND circuit including the interconnections 54a, 54b as two input terminals, the interconnection 54c as the output terminal, the interconnections 54d, 54e as the power source terminals and the interconnection 54f as the earth terminal is formed.

The semiconductor device according to the present embodiment is characterized mainly in that, as shown in FIG. 8, extended portions extended perpendicularly to the extending direction of the local interconnections 38 are provided on the end parts of the local interconnections 38 upon the design pattern. Thus, providing the extended portions at the design pattern can compensate the shrinkage of the pattern end parts due to the proximity effect upon the exposure, whereby the reliability of the electrical contact between the local interconnections 38 and the upper interconnections 54 can be higher. The extended portions are provided in parallel with the gate interconnections 22 intersecting the local interconnections 38, whereby the intended object can be attained without increasing a pitch between the gate interconnections 22.

Next, the method for fabricating the semiconductor device according to the present embodiment will be explained with reference to FIGS. 10A to 13B. FIGS. 10A to 11B are sectional views of the semiconductor device along the line A–A' in FIG. 8, which are in the steps of the method for fabricating the semiconductor device. FIGS. 12A to 13B are sectional views of the semiconductor device along the line B–B' in FIG. 8, which are in the steps of the method for fabricating the semiconductor device.

First, the device isolation film 12 buried in a p-type silicon substrate 10 is formed by, e.g., STI (Shallow Trench Isolation) method. For example, a 200nm-depth trench is formed in the silicon substrate 10 by photolithography and dry etching. Then, a silicon oxide film of, e.g., a 500 nm-thick is formed on the silicon substrate 10 by, e.g., CVD method. Next, the silicon oxide film is polished by, e.g., CMP (Chemical Mechanical Polishing) method to leave the silicon oxide film selectively in the trench. Thus, the device isolation film 12 of the silicon oxide film buried in the trench is formed.

Thus, the device region 14n for n-channel transistors to be formed in and the device region 14p for p-channel transistors to be formed in are defined by the device isolation film 12.

Figure 11A:
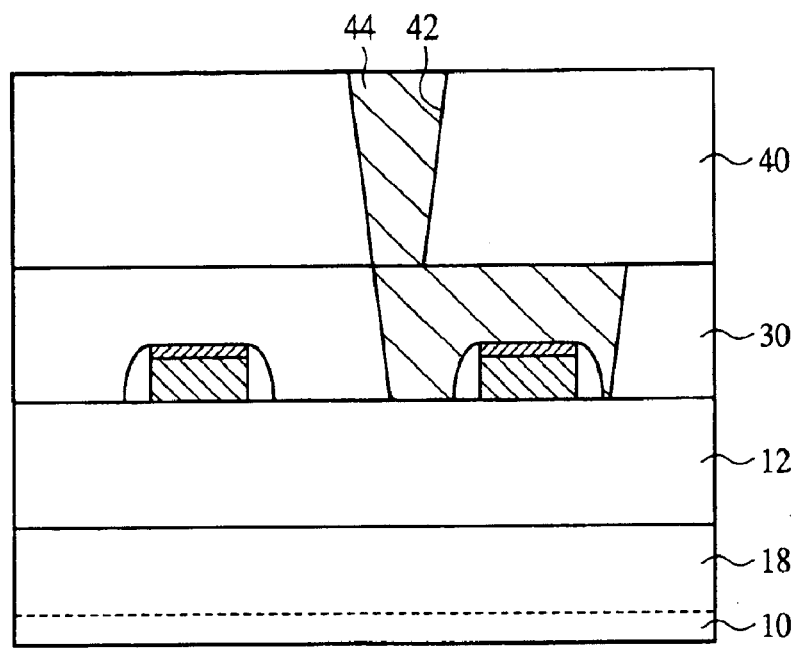

Then, a photoresist film exposing the region for the p-well to be formed in including the device region 14n is formed, and then with the photoresist film as the mask, boron ions ($B^+$), for example, are implanted at a 300 keV acceleration energy and to a dose of $3\times10^{13}$ cm$^{-2}$. Then, a photoresist film exposing the region for the n-well to be formed in including the device region 14p is formed, and then with the photoresist film as the mask, phosphorus ions ($P^+$) are implanted at a 600 keV acceleration energy and to a dose of $3\times10^{13}$ cm$^{-2}$. Thus, p-well (not shown) is formed in the region including the device region 14n, and the n-well 18 is formed in the region including the device region 14p (FIG. 9A, FIG. 11A).

Then, a silicon oxide film of, e.g., a 4 nm-thick is formed by thermal oxidation on the silicon substrate 10 in the device regions 14n, 14p. Thus, the gate insulating film 20 of the silicon oxide film is formed.

Next, a polycrystalline silicon film of e.g., a 180 nm-thick is deposited on the gate insulating film 20.

Then, the polycrystalline silicon film is patterned by photolithography and dry etching to form the gate electrodes 22 of the polycrystalline silicon film. As shown in FIG. 8, the gate electrodes 22 have linear patterns which are extended continuously over the device regions 14n, 14p, and the two gate electrodes 22 are arranged in parallel with each other.

Next, a photoresist film exposing the device region 14n is formed, and then with the photoresist film and the gate electrodes 22 as the mask, arsenic ions ($As^+$), for example, are implanted at a 5 keV acceleration energy and to a dose of $8\times10^{14}$ cm$^{-2}$. Thus, the LDD regions of the n-channel transistors are formed in the silicon substrate 10 in the device region 14n.

Then, a photoresist film exposing the device region 14p is formed, and then with the resist film and the gate electrodes 22 as the mask, boron ions, for example, are implanted at a 0.5 keV acceleration energy and to a dose of $8\times10^{14}$ cm$^{-2}$. Thus, the LDD regions of the p-channel transistors are formed in the silicon substrate 10 in the device region 14p.

Next, a silicon oxide film of, e.g., a 10 nm-thick and a silicon nitride film of, e.g., a 100 nm-thick are formed by, e.g., CVD method.

Then, the silicon nitride film and the silicon oxide film are etched back to form a sidewall insulating film 24 of the silicon oxide film and the silicon nitride film on the side walls of the gate electrodes 22.

Next, a photoresist film exposing the device region 14n is formed, and then with the photoresist film, the gate electrodes 22 and the sidewall insulating film 24 as the mask, phosphorus ions, for example, are implanted at a 15 keV acceleration energy and to a dose of $1\times10^{15}$ cm$^{-2}$. Thus, the source/drain regions (not shown) of the n-channel transistors are formed in the silicon substrate 10 in the device region 14n.

Then, a photoresist film exposing the device region 14p is formed, and then with the photoresist film, the gate electrodes 22 and the sidewall insulating film 24 as the mask, boron ions, for example, are implanted at a 5 keV acceleration energy and to a dose of $1\times10^{15}$ cm$^{-2}$. Thus, the source/drain regions 26 of the p-channel transistors are formed in the silicon substrate 10 in the device region 14p.

Next, thermal processing is performed in nitrogen ambient, e.g., at 1000° C. for 10 seconds to activate the implanted ions to complete the n-channel transistors and the p-channel transistors.

Figure 11B:
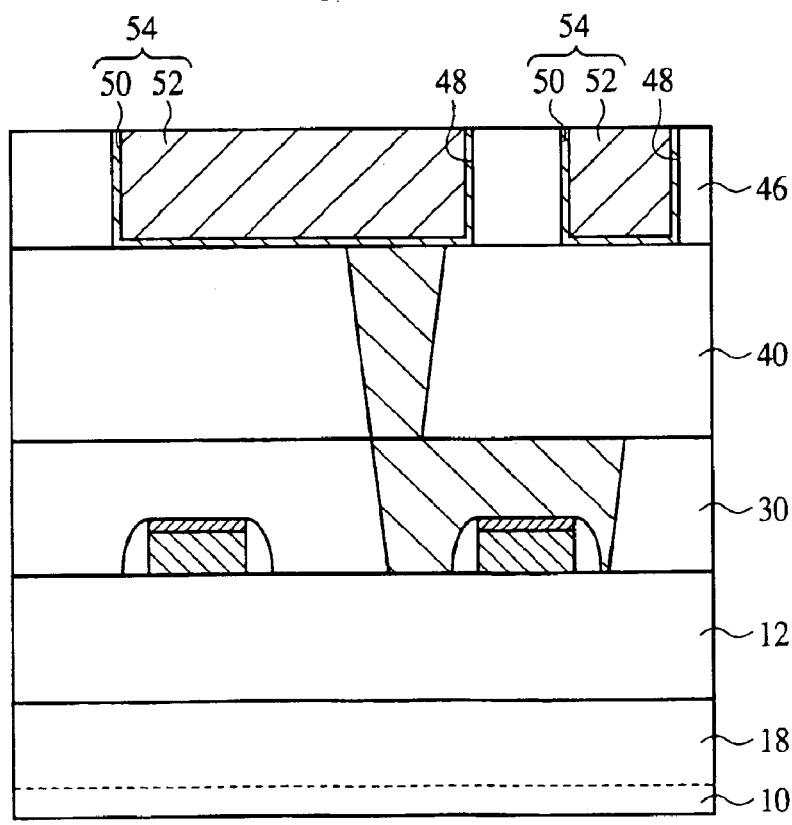

Next, a cobalt silicide film 28 is formed selectively on the silicon-exposed parts of the device regions 14, 14p and the gate electrodes 22 by salicide process (FIG. 9B, FIG. 11B). For example, a cobalt film of, e.g., a 10 nm-thick is deposited on the entire surface, thermal processing is performed to silicidize locally the cobalt film on the silicon-exposed parts, and then unreacted cobalt film is removed. Thus, the cobalt silicide film 28 is selectively formed.

Next, a silicon oxide film of, e.g., a 1000 nm-thick is deposited on the entire surface by, e.g., CVD method.

Then, the silicon oxide film is made flat by, e.g., CMP method to form the inter-layer insulating film 30 formed of the silicon oxide film and having the surface flattened.

Next, contact holes 32 for forming the contact plugs 36 to be connected to the source/drain regions 28, etc. and the interconnection grooves 34 for forming the local interconnections 38 to be connected to the gate electrodes 22 are formed in the inter-layer insulating film 30 by lithography and dry etching. The width of the interconnection grooves 34 is, e.g., 120 nm.

To form the interconnection grooves 34, as shown in FIG. 8, design pattern having the extended portions which are extended perpendicularly to the longitudinal direction of the main interconnection portions is used. The length of the extended portions are, e.g., 40 nm which is ⅓ of the interconnection width. The extended portions are arranged in parallel with the gate electrodes 22, which permits the extended portions to be provided without increasing a pitch between the gate electrodes 22. The provision of the extended portions can compensate the shrinkage of the pattern end parts.

In a region on the design pattern, where a sufficient end allowance can be ensured, the extended portions are not required to be extended essentially perpendicularly to the longitudinal direction of the main interconnection portions and may be provided along the longitudinal direction of the main interconnection portions. T-shaped extended portions may be also provided.

Then, a titanium (Ti) film of, e.g., a 10 nm-thick, a titanium nitride (TiN) film of, e.g., a 20 nm-thick and a tungsten (W) film of, e.g., a 300 nm-thick are deposited by, e.g., CVD method.

Next, the tungsten film, titanium nitride film and the titanium film are removed by, e.g., CMP method until the surface of the inter-layer insulating film 28 is exposed. Thus, the contact plugs 36 buried in the contact holes 32 and the local interconnections 38 buried in the interconnection groves 34 are formed (FIG. 9C, FIG. 11C).

Then, on the inter-layer insulating film 28 with the contact plugs 36 and the local interconnections 38 buried in, a silicon oxide film of, e.g., a 300 nm-thick is formed by, e.g., CVD method to form the inter-layer insulating film 40 of the silicon oxide film.

Then, contact holes 42 are formed in the inter-layer insulating film 40 down to the contact plugs 36 or the local interconnections 38 by photolithography and dry etching. As shown in FIG. 8, the contact holes 42 has a 140 nm-width, which is larger than the width of the interconnection layer 32, so that the contact holes are beyond the edges of the local interconnections 38.

Next, a titanium (Ti) film of, e.g., a 10 nm-thick, a titanium nitride (TiN) film of, e.g., a 20 nm-thick and a tungsten (W) film of, e.g., a 300 nm-thick are deposited by, e.g., CVD method.

Figure 10A:
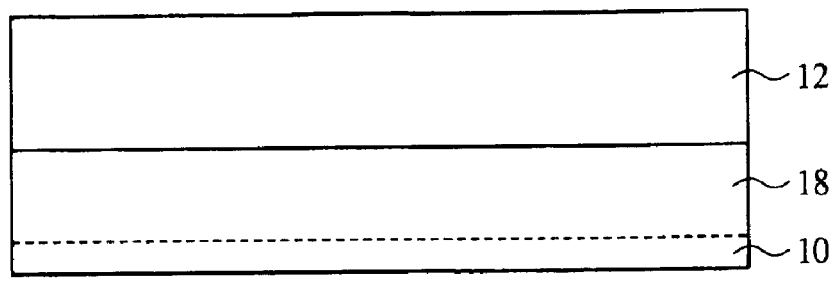
FIGS. 10A–10C, 11A–11B, 12A–12C and 13A–13B are sectional views of the semiconductor device according to the embodiment of the present invention in the steps of the method for fabricating the same, which show the method.
Figure 10B:
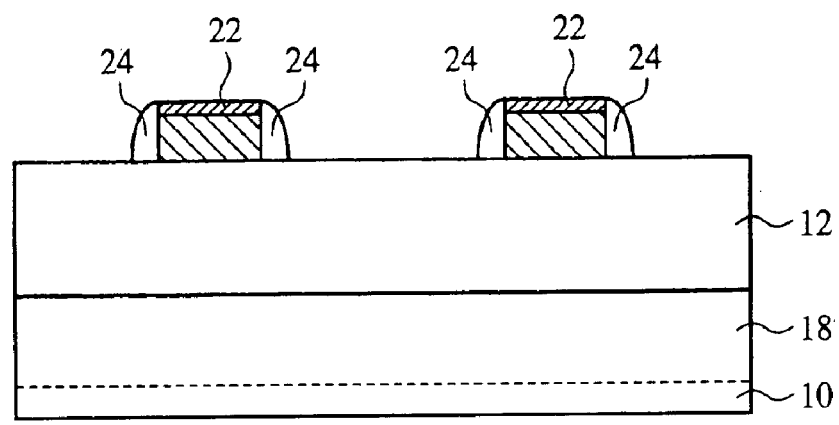
Figure 10C:
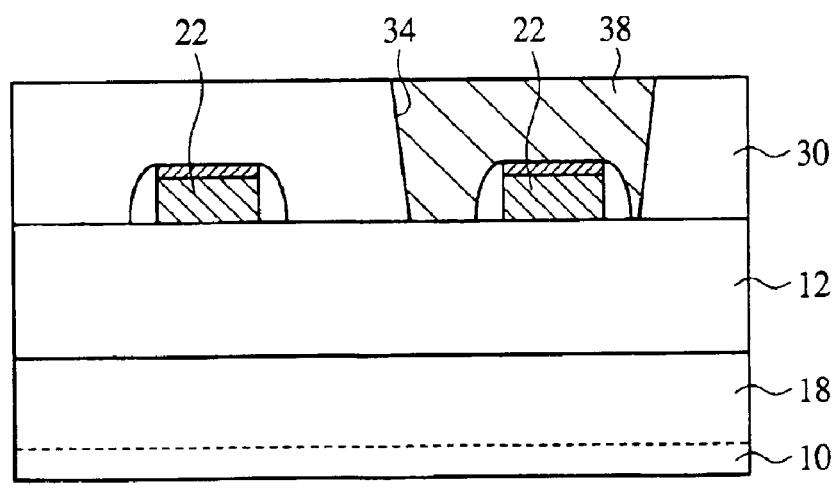
Figure 12A:
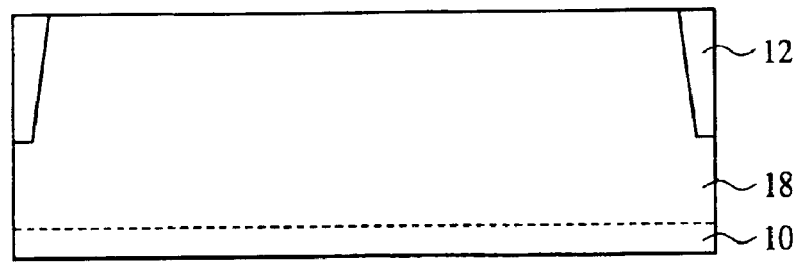
Figure 12B:
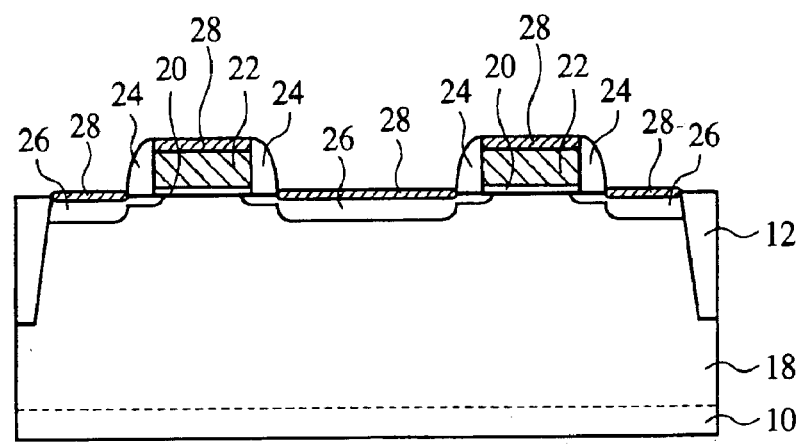
Figure 12C:
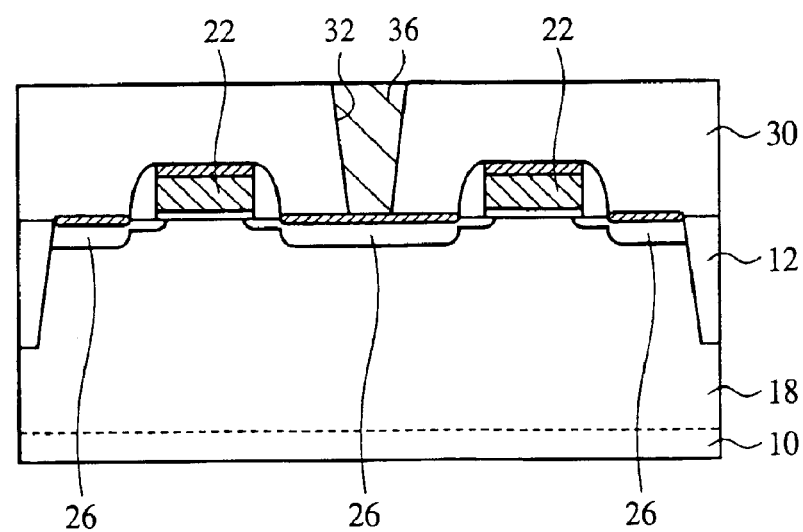
Figure 13A:
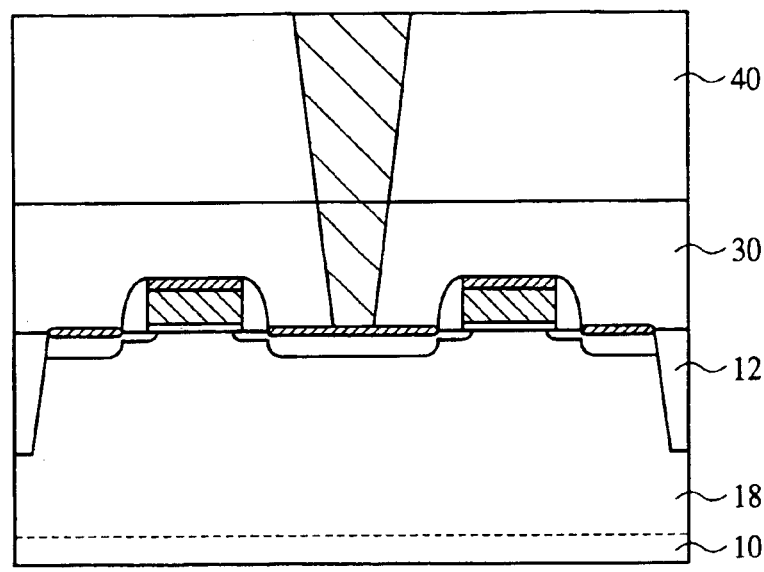
Figure 13B:
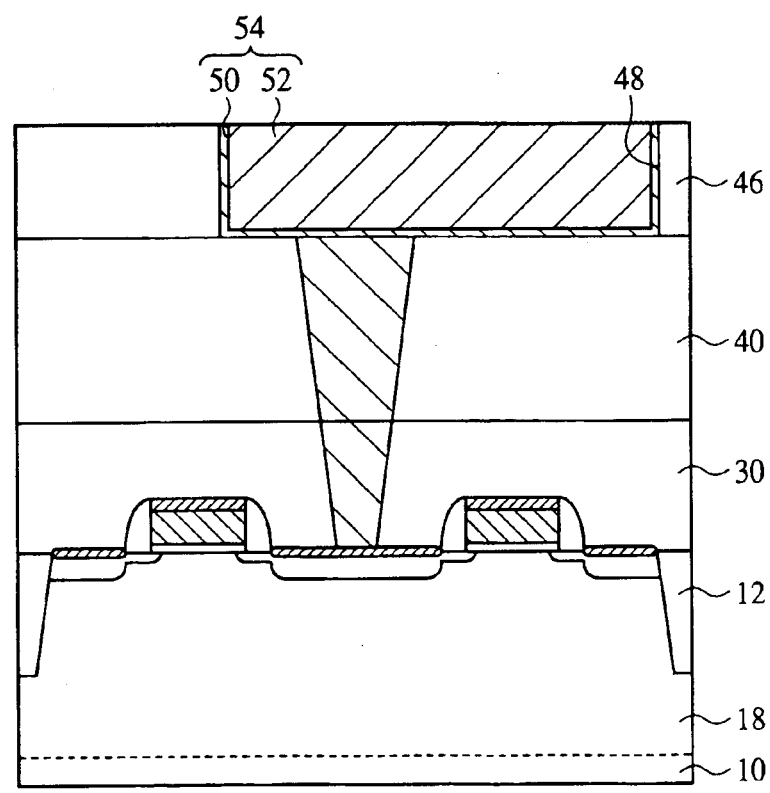

Then, the tungsten film, the titanium nitride film and the titanium film are removed by, e.g., CMP method until the surface of the inter-layer insulating film 40 is exposed. Thus, the contact plugs 44 buried in the contact holes 42 are formed (FIG. 10A, FIG. 12A).

Next, on the inter-layer insulating film 40 with the contact plugs 44 buried in, a silicon oxide film of, e.g., a 300 nm-thick is formed by, e.g., CVD method to form the inter-layer insulating film 46 of the silicon oxide film.

Next, the interconnection grooves 48 are formed in the inter-layer insulating film 46 by lithography and dry etching.

Then, a tantalumnitride (TaN) film of, e.g., a 50 nm-thick is formed by, e.g., CVD method to form the barrier metal 50 of the tantalum nitride film.

Next, on the barrier metal 50, a copper (Cu) film 52 of, e.g., a 1000 nm-thick is formed by, e.g., plating.

Next, the copper film 52 and the barrier metal 50 are removed by, e.g., CMP method until the surface of the inter-layer insulating film 46 is exposed to form the interconnection layer 54 of the copper film 52 and the barrier metal 50 buried in the interconnection grooves 48.

As described above, according to the present embodiment, in forming the local interconnections connected to the gate electrodes, the interconnection grooves for the local interconnections to be buried in are formed by using design pattern having the extended portions provided on the pattern end parts of the main interconnection portions and extended perpendicularly to the extending direction of the main interconnection portions, whereby the interconnection grooves can be formed while the shrinkage of the pattern end parts due to the proximity effect upon the exposure is suppressed. Accordingly, the reliability of the electrical contact with the upper interconnection layer connected to the end parts of the local interconnections can be higher.

[Modified Embodiments]

The present invention is not limited to the above-described embodiment and can cover other various modifications.

For example, in the above-described embodiment, the present invention is applied to a semiconductor device including 2-input NAND circuit. However, devices the present invention is applicable to are not limited to the above-described semiconductor device. The present invention is applicable widely to semiconductor devices including electrical contacts connected to the damascene interconnections.

In the above-described embodiment, the present invention is applied to the local interconnections connected to the gate interconnections. However, the present invention is not applicable limitedly to the local interconnections and is applicable widely to damascene interconnections. For example, the present invention may be applied to the process of forming local interconnections insulated with respect to the gate electrodes. The present invention is applicable to the process of forming the gate electrodes of damascene transistors having the gate electrodes formed by damascene process. The present invention is applicable to upper metal interconnections formed by damascene process.

What is claimed is:

1. A semiconductor device comprising:
   a first insulating film formed over a semiconductor substrate;
   a gate electrode formed over the semiconductor substrate;
   an interconnection buried in at least a surface side of the first insulating film and formed horizontally with respect to the semiconductor substrate, the interconnection having a main interconnection portion extended perpendicularly to an extending direction of the gate electrode and being in contact with the gate electrode and an extended portion provided at an end part of the main interconnection portion and extended horizontally with respects to the extending direction of the gate electrode; and
   a second insulating film formed on the first insulating film and having a contact hole down to the end part of the main interconnection portion of the interconnection.

2. A semiconductor device according to claim 1, wherein the extended portion is extended from the end part in one direction perpendicular to the extending direction of the main interconnection portion.

3. A semiconductor device according to claim 1, wherein the extended portion is extended from the end part in both directions perpendicular to the extending direction of the main interconnection portion.

4. A semiconductor device according to claim 1, wherein a minimum width of the contact hole is larger than a minimum width of the interconnection.

5. A semiconductor device according to claim 1, wherein the width of the extended portion in the extending direction of the main interconnection portion is below a width of the main interconnection portion.

6. A semiconductor device comprising:
   a gate electrode formed over a semiconductor substrate, extended in a first direction;
   a first insulating film formed over the semiconductor substrate with the gate electrode formed on;
   an interconnection buried in at least a surface side of the first insulating film and formed horizontally with respect to the semiconductor substrate, the interconnection having a main interconnection portion extended in a second direction intersecting the first direction, being in contact with the gate electrode and bridging the gate electrode and an extended portion provided at an end part of the main interconnection portion and extended in the first direction; and
   a second insulating film formed on the first insulating film, and having a contact hole down to the end part of the main interconnection portion of the interconnection.

7. A semi conductor according to claim 6, wherein a width of the extended portion in the second direction is below a width of the main interconnecting portion.

8. A semiconductor device comprising:

a first insulating film formed over a semiconductor substrate;

a gate electrode formed over the semiconductor substrate;

an interconnection buried in at least a surface side of the first insulating film and formed horizontally with respect to the semiconductor substrate, the interconnecting having a main interconnection portion being in contact with the gate electrode and having a length along an extended portion provided at an end part of the main interconnection portion and extended horizontally with respect to the extending direction of the gate electrode; and a second insulating film formed on the first insulating film and having a contact hole down to the end part of the main interconnecting portion of the interconnection.

* * * * *